United States Patent
Graebner et al.

[11] Patent Number: 6,049,155
[45] Date of Patent: Apr. 11, 2000

[54] THERMALLY TUNABLE SURFACE ACOUSTIC WAVE DEVICES

[75] Inventors: John Edwin Graebner, Short Hills; Sungho Jin, Millington; Hareesh Mavoori, Berkeley Heights; Wei Zhu, Warren, all of N.J.

[73] Assignee: Lucent Technologies Inc., Murray Hill, N.J.

[21] Appl. No.: 08/961,542

[22] Filed: Oct. 27, 1997

[51] Int. Cl.⁷ .................................................. H01L 41/08
[52] U.S. Cl. ................................ 310/313 R; 310/313 A; 310/346; 333/155
[58] Field of Search ........................... 310/313 R, 313 A, 310/343, 346; 333/195

[56] References Cited

U.S. PATENT DOCUMENTS

| | | | |
|---|---|---|---|
| 3,809,931 | 5/1974 | White et al. .......................... | 310/313 R |
| 3,916,348 | 10/1975 | Toda et al. ........................... | 310/346 X |
| 3,943,389 | 3/1976 | Hickernell et al. .................. | 310/313 R |
| 4,037,176 | 7/1977 | Ono et al. ............................... | 333/155 |
| 4,110,653 | 8/1978 | Hartmann ............................ | 310/313 R |
| 4,516,049 | 5/1985 | Mikoshiba et al. .................. | 310/313 A |

FOREIGN PATENT DOCUMENTS

| | | | |
|---|---|---|---|
| 0080913 | 7/1981 | Japan ................................. | 310/313 R |
| 0080914 | 7/1981 | Japan ..................................... | 333/155 |
| 0156215 | 9/1983 | Japan ..................................... | 333/155 |
| 0092021 | 5/1986 | Japan ..................................... | 333/155 |
| 0261013 | 10/1989 | Japan ..................................... | 333/155 |
| 1064426 | 12/1983 | Russian Federation ............... | 333/155 |

*Primary Examiner*—Mark O. Budd

[57] ABSTRACT

In accordance with the invention, the piezoelectric layer of a SAW device is mechanically coupled to a substrate of temperature-sensitive material having a large coefficient of thermal expansion or contraction. In a preferred embodiment, the temperature-sensitive material is a nickel/titanium alloy having high negative coefficient of thermal expansion of about $-200 \times 10^{-6}$. The frequency of the device can be tuned by changing the temperature of operation.

11 Claims, 4 Drawing Sheets

THERMALLY TUNABLE SURFACE ACOUSTIC WAVE DEVICES

FIELD OF THE INVENTION

This invention relates to surface acoustic wave devices and, in particular, to thermally tunable surface wave devices particularly useful as tunable high-frequency filters.

BACKGROUND OF THE INVENTION

Surface acoustic wave devices (SAW devices) utilize elastic waves generated along the surface of a piezoelectric layer to perform a variety of useful functions. A typical SAW device comprises a pair of surface wave transducers disposed on a smooth surfaced piezoelectric substrate. The transducers are typically interdigital transducers (IDTs), each comprising a pair of alternating, interpenetrating finger-shaped electrodes. The piezoelectric substrate is typically lithium niobate, lithium tantalate or quartz. In operation, a transducer is driven by a radio frequency source (as by applying the source between the electrodes of an IDT) and a surface acoustic wave is launched across the substrate to the second transducer where it can be picked up as an RF signal.

Surface acoustic wave devices can be used in a variety of applications including filtering, provision of signal delay and generation of high frequency oscillations. Such devices and their applications are described in greater detail in the following publications, all of which are incorporated herein by reference: C. Hartman et al., *Proceedings of the 37th Annual Frequency Control Symposium*, p. 354 et seq. (1993); R. Weigel et al., *Proceedings of the 1996 IEEE Microwave Theory and Technology Conf.*, Paper No. WE1A-5, p.413 (June 1996); Y. Taguchi et al., *Proceedings of the 1996 IEEE Microwave Theory and Technology Conf.*, Paper No. WE1A-5, p:417 (June 1996); S. Shikata et al., *Proceedings of the Third International Conf. on Applications of Diamond Films and Related Materials*, NIST Special Publication No. 885, p. 29 (1995) and M. Feldmann et al., *Surface Acoustic Waves for Signal Processing*, Chap. 4 (Artech House, 1989).

One important limitation on SAW devices for telecommunications applications is that they are difficult to tune. A SAW filter, for example, is inherently a narrow bandwidth device with a maximum filtering response at a frequency $f=v_p/\lambda$ where $v_p$ is the acoustic phase velocity of the sound transmitting medium and $\lambda$ represents the geometric spacing of the IDT fingers. Since $v_p$ and $\lambda$ in a conventional SAW device are fixed, such devices operate at a fixed frequency and lack the tunability required for many telecommunications applications. Accordingly, there is a need for a tunable SAW device.

SUMMARY OF THE INVENTION

In accordance with the invention, the piezoelectric layer of a SAW device is mechanically coupled to a substrate of temperature-sensitive material having a large coefficient of thermal expansion or contraction. In a preferred embodiment, the temperature-sensitive material is a nickel/titanium alloy having high negative coefficient of thermal expansion of about $-200 \times 10^{-6}/°$ C. The frequency of the device can be tuned by changing the temperature of operation.

BRIEF DESCRIPTION OF THE DRAWINGS

The advantages, nature and additional features of the invention will appear more fully upon consideration of the illustrative embodiments to be described in the accompanying drawings. In the drawings.

It is to be understood that these drawings are for purposes of illustrating the concepts of the invention and, except for the graphs, are not to scale.

DETAILED DESCRIPTION

Application of an elastic stress, e.g., a compressive stress S on the sound propagating medium in the direction of SAW propagation, is expected to affect the SAW frequency f by at least three mechanisms:

1. The acoustic velocity vp generally increases as the atoms are forced closer together and the effective stiffness constants $c_{ij}$ (elastic constants) are slightly increased due to a small quadratic dependence of the strain on applied stress.
2. This increase in stiffness is partially offset by the increase in mass density $\rho$, which varies only linearly with the stress.
3. The wavelength $\lambda$ defined by the IDT finger spacing on the substrate decreases as the substrate is compressed in length.

The effect on f of these three mechanisms can be observed by writing $$f=v_p/\lambda=(c_{ij}/\rho)^{1/2}/\lambda, \text{ or } v_p=(c_{ij}/\rho)^{1/2}$$

and the dependence of SAW frequency on stress S is given by $$\frac{1}{f}\frac{\partial f}{\partial S} = \frac{1}{2}\frac{1}{c_{ij}}\frac{\partial c_{ij}}{\partial S} - \frac{1}{2}\frac{1}{\rho}\frac{\partial \rho}{\partial S} + \frac{1}{\lambda}\left|\frac{\partial \lambda}{\partial S}\right|.$$

The last two terms are equal and opposite except for the factor of ½. Therefore if the stiffness constants increase with compressive stress, which is the usual case, the SAW frequency will also increase with compressive stress. In the inventive device, the sound-propagating medium is controllably stressed via its attachment onto a temperature-sensitive element which expands or contracts when the temperature of the device is lowered or raised. The extent of the strain in the temperature-sensitive element, and hence in the sound-propagating medium is controlled by the magnitude of the heating or cooling. The SAW frequency is thus tunable by adjusting the temperature.

Figure 1:
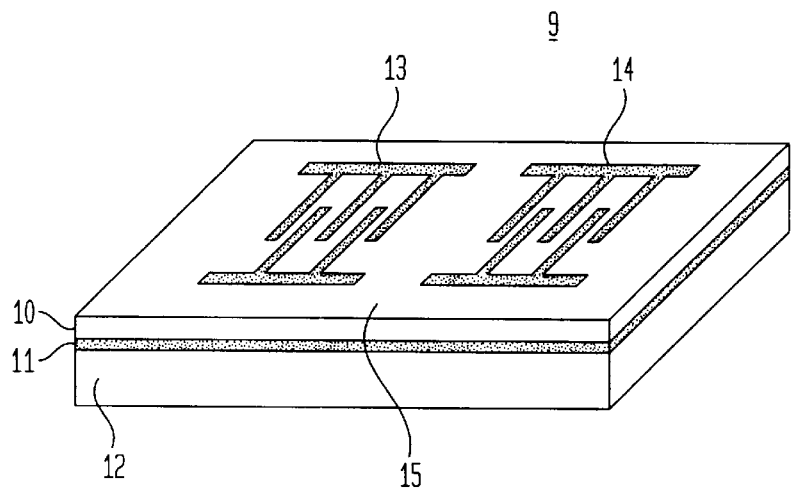
FIG. 1 is a perspective view of a thermally tunable SAW device.

Referring to the drawings, FIG. 1 is a perspective view of a thermally tunable SAW device 9 comprising a layer 10 of piezoelectric material mechanically coupled, as by an adhesive bonding layer 11, to a substrate 12 comprising temperature-sensitive material. A pair of surface wave transducers 13, 14, such as spaced apart IDT electrode pairs, are coupled to a smooth surface 15 of layer 10.

The electrodes are typically made of conductive metals such as Al or Cu films, and typically have a thickness in the range of 0.05 to 100 micrometers. The width and spacing of the interdigitated pattern are typically in the range 0.1 to 1000 micrometers, depending on the desired operating frequency. Instead of the transversal filter type SAW device illustrated in FIG. 1, a resonator type SAW device comprising one set of IDT fingers and reflecting gratings can alternatively be utilized.

The piezoelectric layer 10 is preferably lithium niobate, lithium tantalate, lithium borate, quartz or a composite layer structure containing a piezoelectric layer and a high acoustic velocity material (e.g., ZnO/diamond, ZnO/sapphire, AlN/diamond, AlN/sapphire, ZnO/Al/glass). The desired thickness of the layer depends on the operating frequency and the wavelength of the acoustic waves. The thickness is desirably at least as thick as the acoustic wavelength. For gigahertz signals, the desired thickness is in the range 0.1 to 2000 micrometers and preferably 0.5 to 500 micrometers.

Typically the substrate 12 will comprise a body or layer of temperature-sensitive material. The temperature-sensitive material is preferably a material exhibiting a high coefficient of thermal expansion or contraction (CTE) in excess of about $50 \times 10^{-6}/°$ C. The preferred material is an alloy of nickel and titanium with an approximate composition of 56% by weight of Ni and 44% Ti. For ease of stress transfer to the piezoelectric layer, the substrate is at least 3 times the thickness of the piezoelectric layer and preferably at least 10 times the thickness.

Common metallic and ceramic materials which have sufficient strength and stability to maintain a constant level of stress on the piezoelectric layer typically have an impractically small coefficient of thermal expansion for this application. Such materials typically exhibit near room temperature, a CTE in the range 0 to $25 \times 10^{-6}/°$ C. For a temperature variation $\Delta T$ of about 30° C., such materials would provide a temperature-induced strain of only about $7.5 \times 10^{-4}$ (or 0.075%) which is not sufficient for broadband control of a SAW device.

More convenient for the present application are alloys which undergo phase transformations near room temperature. Such materials typically undergo much larger dimensional changes with temperature than the usual expansion or contraction, permitting operation of a thermally tunable SAW device with less required temperature excursion.

The desired composition range of the Ni—Ti based temperature-sensitive material is typically 48–64 weight % Ni and the balance Ti, and preferably 52–60% Ni and the balance Ti. Other alloying elements such as V, Cr, Mn, Fe, Co, Mo, Nb, Ta, W, Pd, Cu, and Zn may also be present in an amount less than 5 wt % as long as the temperature range of phase transformation is near ambient temperature, e.g., between −50° and +150° C. Other alloys with phase transformation occurring near ambient temperature may also be used, for example, Cu—Zn—Si (30–40 wt % Zn, 0.5–1.5% Si, balance Cu), Cu—Al—Ni (10–20% Al, 1–5% Ni, balance Cu) and Cu—Sn (20–30% Sn, balance Cu). The CTE may be positive or negative depending on the specific alloy composition and processing. In shape memory alloys involving martensitic and stress-induced phase transformations, the type and degree of residual stress in the processed alloy can be adjusted to control the magnitude and the sign of CTE. The desired magnitude of CTE in the temperature-sensitive body is at least $30 \times 10^{-6}/°$ C., preferably at least $50 \times 10^{-6}$, and even more preferably at least $100 \times 10^{-6}$ near ambient temperature.

Figure 2:
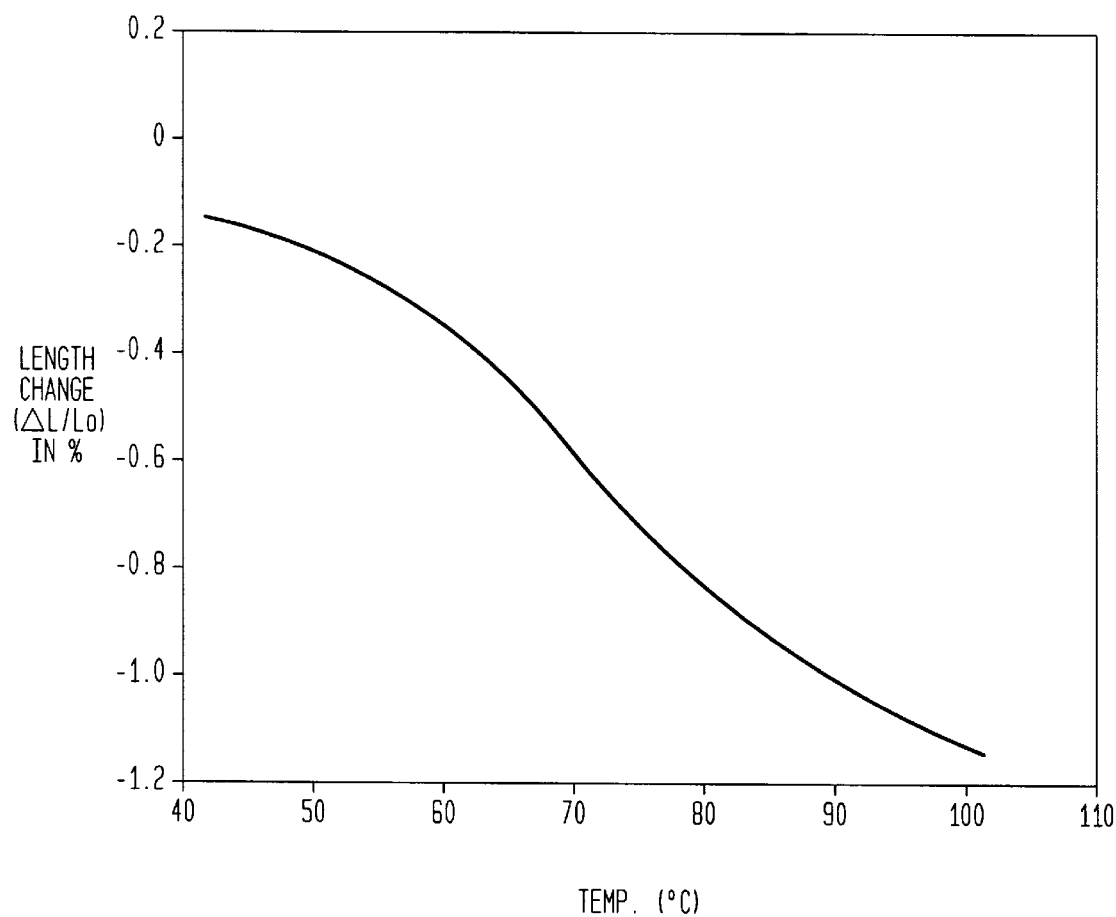
FIG. 2 is a graphical plot showing the relative thermal expansion of a Ni/Ti alloy rod as a function of temperature.

The preferred nickel/titanium alloy undergoes a phase transformation near room temperature. FIG. 2 is a graphical plot showing the relative thermal expansion $\Delta L/L_o$ for a 56% Ni— 44% Ti alloy rod (0.120 inch diameter) as a function of temperature. For the temperature range 50°–80° C., the CTE is about $-200 \times 10^{-6}/°$ C. This is almost an order of magnitude higher than most metals and ceramics.

The sound conducting layer or layers can be mechanically coupled to the substrate 12 not only by adhesive bonding as with epoxy but also by sputter deposition, soldering, brazing or mechanical clamping.

Figure 3:
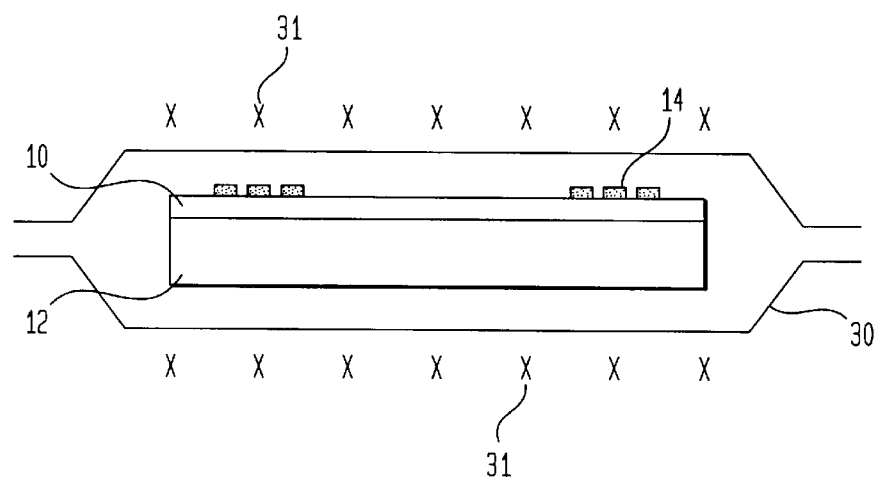
FIG. 3 is a schematic cross section showing the device of FIG. 1 disposed within an oven for thermal tuning.

FIG. 3 is a schematic cross section showing the device of FIG. 1 disposed within an insulated oven 30 provided with heating coils 31 for thermal tuning of the device operating frequency. The thermal expansion or contraction of the temperature-sensitive body induces elastic strain in the attached piezoelectric layer with accompanying change in the acoustic velocity $v_p$ in the piezoelectric layer, and also a slight change in the IDT finger spacing ($\lambda$). The filtering frequency $f=v_p/\lambda$ is then essentially proportionally altered, providing temperature-controlled tuning. The desirable tunable range of frequency for a 30° C. temperature excursion is 0.5–5% of the operating frequency. For example, for a SAW frequency of 2 GHz, this tunable range amounts to 10–100 MHz.

The controlled heating or cooling of the temperature-sensitive body can be achieved in other ways such as by use of an RF induction heater or a quartz lamp heater. Using feedback from a thermocouple (not shown), the temperature can be altered to a desired value corresponding to a desired strain and can be maintained using an insulating oven until a need arises to alter the frequency again. The heater may be placed inside or outside the oven.

Figure 4:
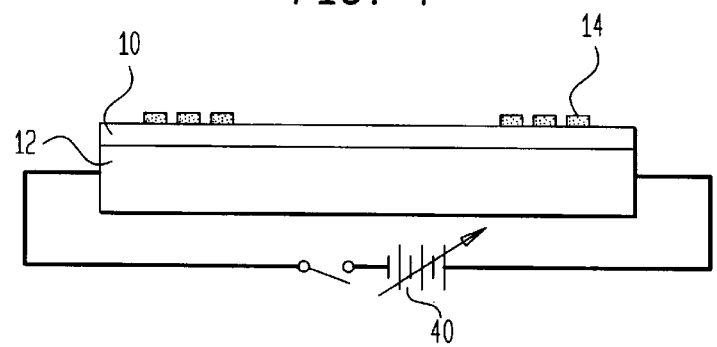
FIGS. 4 thru 9 are alternative embodiments of thermally tunable SAW devices.

FIG. 4 is a cross section illustrating an alternative method of heating the temperature-sensitive substrate 12. Specifically, the substrate 12 is chosen to be a resistive material (such as the previously described Ni/Ti alloy) and a controllable voltage source 40 is switchably connected across the substrate to drive a current through it. The substrate is thus heated by resistance to the current.

Figure 5:
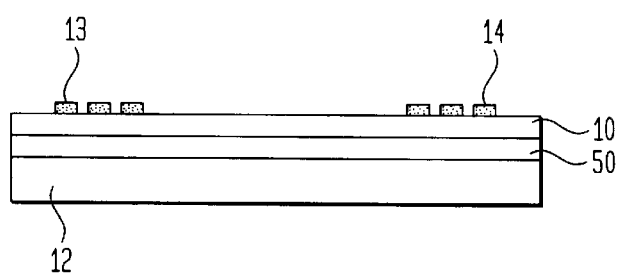

It is also possible to use a composite layer of material to conduct the surface acoustic wave. Thus as shown in FIG. 5, the piezoelectric layer 10 can be in the form of a thin film deposited on, for example, a non-piezoelectric layer 50 of high acoustic velocity material such as diamond or sapphire, so that a higher frequency of operation can be achieved for a given IDT spacing. The acoustic velocity of the added layer 50 is tuned via thermally controlled expansion or contraction of a mechanically coupled temperature-sensitive body.

Indeed, a thin film of piezoelectric material can be bonded to the temperature-sensitive substrate so that the substrate itself takes part in surface wave transmission. In this case, the induced temperature change not only stresses the piezoelectric layer but also directly modifies the acoustic velocity in the temperature-sensitive medium.

Figure 6:
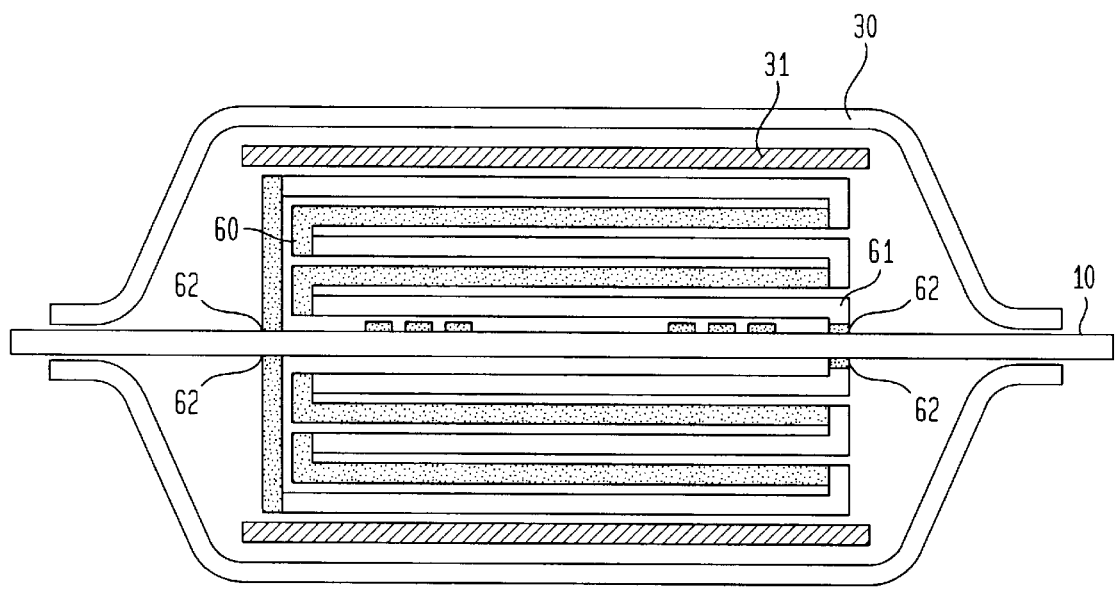

FIG. 6 shows another embodiment of a tunable SAW device wherein thermal tuning is achieved by mechanically amplifying the temperature-induced strain. The device uses a stack of temperature-insensitive (low CTE) layers 60, such as Invar, alternately interconnected to temperature-sensitive layers 61 to effectively increase the temperature-sensitive length. The mechanical coupling is by bonding at points 62. Alternating temperature-sensitive layers and temperature-insensitive layers are interconnected so that the opposite ends of the temperature-sensitive layers are connected. The temperature-induced strain from the layers are accumulated to yield amplified strain on the coupled sound-transmitting medium. For example, an assembly consisting of 10 temperature-sensitive layers of 56% Ni— 44% Ti alloy (CTE ~ $-200 \times 10^{-6}/°$ C.) will produce, for a temperature excursion $\Delta T=30°$ C., a total strain of $(\epsilon)=10 \times 200 \times 10^{-6}/°$ C. $\times 30°$ C.$=6 \times 10^{-2}$ or 6%. This is a large amount of elastic strain and can significantly alter the SAW frequency. In view of this large amplification factor, the temperature-sensitive body can be made up of materials such as typical metals and alloys, e.g. brass (Cu— 30% Zn) with CTE=+20.1×10$^{-6}$/° C., stainless steel (Fe— 18% Cr— 8% Ni) with CTE=+17.8×10$^{-6}$/° C., and Fe—Ni—Cr alloy (Fe 35% Ni— 20% with CTE=15.8×10$^{-6}$/° C.). The temperature-insensitive layers can be made up of Invar (Fe— 36% Ni alloy) or other alloys of low CTE, as long as their CTE is substantially lower than that of the temperature-sensitive layers. Alternatively, successive layers with opposite sign of CTE can be used to amplify the temperature-induced strain even further. The metallic layers can be connected by soldering, brazing, spot welding, epoxy bonding, or mechanical attachment.

Plural SAW devices (or plural sound-transmitting medium components) can be secured to a single temperature-sensitive body. For example, a device containing a plurality of SAW filters with different SAW frequencies (e.g., $f_1$–$f_4$ and $f_5$–$f_8$) can be mounted on two different temperature-sensitive bodies, each device having its own heating element and temperature controller. If only one of the temperature-sensitive bodies is activated (heated into the desired temperature level), corresponding frequencies $f_5$–$f_8$ in the attached medium will be operational. If the other temperature-sensitive body is activated, $f_5$–$f_8$ will be operational. A similar configuration can also be used with a multimode of SAW devices with the same frequency if many communication routes are to be controlled simultaneously.

Figure 7:
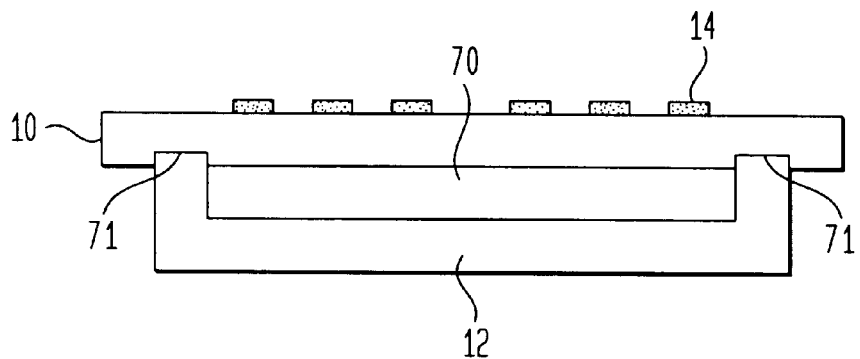
Figure 8:
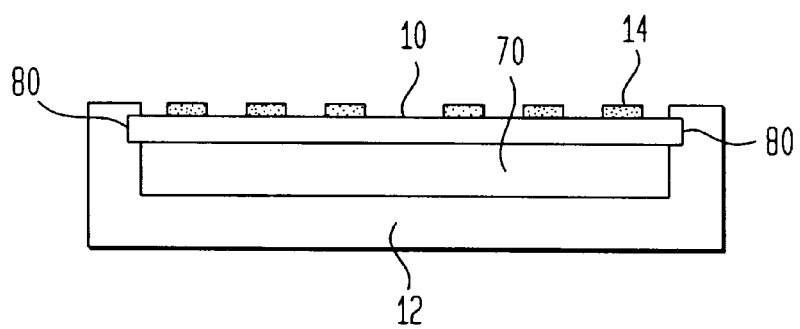

If the temperature-sensitive substrate 12 in FIG. 1 is made of electrically insulating or poorly-conducting material, then there is little concern about possible interference from the capacitance between the metallic IDT and the temperature-sensitive component. If, however, a conductive temperature-sensitive component is used, then the capacitance may become an issue. Thus it is advantageous to minimize the effect by increasing the gap between the two metallic components (the IDT and the temperature-sensitive component). FIGS. 7 and 8 schematically illustrate configurations that provide a capacitance-reducing gap 70 yet allow the transfer of the induced thermal strain to the sound-transmitting medium. The temperature-sensitive body 12 is attached onto the sound-transmitting medium at outside locations well away from the IDT locations. The gap 70 between the sound-transmitting medium and the temperature-sensitive component is at least 0.1 mm and preferably at least 0.5 mm.

The temperature-sensitive body may be operated either on a heating mode or on a cooling mode to control the thermal strain and the acoustic velocity of the sound transmitting medium. The sound transmitting medium can alternatively be placed on a pre-stressed condition, either tensile or compressive, by bonding at high temperatures (e.g. 50–200° C.) and cooling. The thermal contraction or expansion difference induces the pre-stress. For example, if the Ni—Ti alloy with large negative CTE is bonded at 100° C. onto a much thinner LiNbO$_3$ medium and cooled to room temperature, the LiNbO$_3$ medium will be under tensile stress. The magnitude of the stress can be adjusted by the bonding temperature chosen. During SAW frequency tuning, the temperature-sensitive component is heated for dimensional contraction and the tensile stress in LiNbO$_3$ is reduced accordingly for increased SAW frequency. If the bonding of the two components is carried out at a temperature below the SAW tuning temperature regime, then a compressive pre-stressing can be utilized.

In FIG. 7 the temperature-sensitive body 12 component is mechanically coupled to the sound-transmitting medium 10 (and possibly in combination with interface bonding) by utilizing grooves or slots 71 in the sound-transmitting medium.

In FIG. 8 coupling is by grooves or slots 80 in the temperature-sensitive body 12. A sideways mechanical attachment in combination with interface bonding is utilized. If the sound-transmitting medium is operated in a pre-compressed mode and expands during tuning by heating, then the stability of the attachment is improved.

Figure 9:
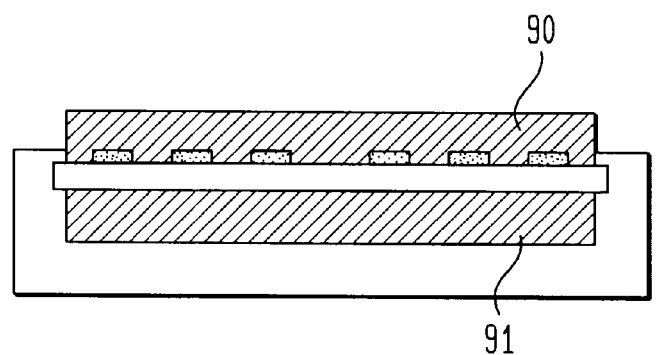

As shown in FIG. 9, the sound-transmitting medium can be sandwiched between two rigid retainer blocks 90, 91 but with lateral sliding allowed, e.g., by using low friction coefficient surfaces. The rigid blocks are preferably composed of electrical insulators. They minimize any buckling during thermal expansion or contraction of the temperature-sensitive body.

The inventive tunable SAW devices are useful as high frequency filters in telecommunications systems, as signal delay lines and as high frequency oscillators. It is to be understood that the above-described embodiments are illustrative of only a few of the many possible specific embodiments which can represent applications of the invention. Numerous and varied other arrangements can be made by those skilled in the art without departing from the spirit and scope of the invention.

What is claimed:

1. A tunable surface acoustic wave device comprising:
    a body of piezoelectric material having a surface;
    at least one set of surface wave transducers coupled to said surface; and
    a body of temperature-sensitive material comprising 48–64 weight % Ni, less than 5 weight % of alloying elements other than Ti, and the remainder Ti mechanically coupled to said body of piezoelectric material, said temperature-sensitive material having a coefficient of thermal expansion or contraction whereby varying the temperature of said material tunes the operating frequency of said surface acoustic wave device.

2. A tunable surface acoustic wave device comprising:
    a body of piezoelectric material having a surface;
    at least one set of surface wave transducers coupled to said surface; and
    a body of temperature-sensitive material comprising a material selected from the group consisting of Ni—Ti, Cu—Zn—Si, Cu—Al—Ni and Cu—Sn mechanically coupled to said body of piezoelectric material, said temperature-sensitive material having a coefficient of thermal expansion or contraction whereby varying the temperature of said material tunes the operating frequency of said surface acoustic wave device.

3. A surface wave device according to claim 2 wherein said body of temperature-sensitive material has a coefficient of thermal expansion or contraction of at least 50×10$^{-6}$/° C.

4. A surface wave device according to claim 2 wherein said body of piezoelectric material is a layer having a thickness and said body of temperature-sensitive material has a thickness of at least 3 times that of the piezoelectric layer.

5. A surface wave device according to claim 2 wherein said body of piezoelectric material is a layer having a thickness and said body of temperature-sensitive material has a thickness of at least 10 times that of the piezoelectric layer.

6. A surface wave device according to claim 2 further comprising a surrounding oven and a heater.

7. A surface wave device according to claim 2 wherein said temperature-sensitive material is electrically resistive and further comprising a controllable electrical source for driving a current through said temperature-sensitive material and thereby heating it.

8. A surface wave device according to claim 2 wherein said body of piezoelectric material is mechanically coupled to said body of temperature-sensitive material by adhesive or solder bonding.

9. A surface wave device according to claim 2 wherein said body of piezoelectric material comprises a layer of piezoelectric material disposed on a layer of material having a high velocity for surface acoustic waves, thereby enhancing the operating frequency of the device.

10. A surface wave device according to claim 2 wherein said body of temperature-sensitive material is metallic and in the region underlying said transducers there is a gap of at least 0.1 mm between the piezoelectric body and the body of metallic temperature-sensitive material thereby reducing unwanted capacitance.

11. A tunable surface acoustic wave device comprising:

a body of piezoelectric material having a surface;

at least one set of surface wave transducers coupled to said surface; and a body comprising temperature-sensitive material mechanically coupled to said body of piezoelectric material, said temperature-sensitive material having a coefficient of thermal expansion or contraction whereby varying the temperature of said material tunes the operating frequency of said surface acoustic wave device, and said body comprising a plurality of temperature-sensitive layers interconnected with a plurality of temperature-insensitive layers to mechanically amplify the temperature induced strain.

* * * * *